AMPLIFIER CIRCUIT HAVING A REACTIVE LOAD

Filed Oct. 28, 1950 3 Sheets-Sheet 1

INVENTOR
B. M. OLIVER
BY Hugh S. Wertz
ATTORNEY

Feb. 17, 1953 B. M. OLIVER 2,629,006

AMPLIFIER CIRCUIT HAVING A REACTIVE LOAD

Filed Oct. 28, 1950 3 Sheets-Sheet 2

INVENTOR
B. M. OLIVER
BY Hugh S. Wertz
ATTORNEY

INVENTOR
B. M. OLIVER
BY Hugh S. Wertz
ATTORNEY

Patented Feb. 17, 1953 2,629,006

UNITED STATES PATENT OFFICE 2,629,006

AMPLIFIER CIRCUIT HAVING A REACTIVE LOAD

Bernard M. Oliver, Morristown, N. J., assignor to Bell Telephone Laboratories, Incorporated, New York, N. Y., a corporation of New York Application October 28, 1950, Serial No. 192,773

4 Claims. (Cl. 175—335)

Figure 1:
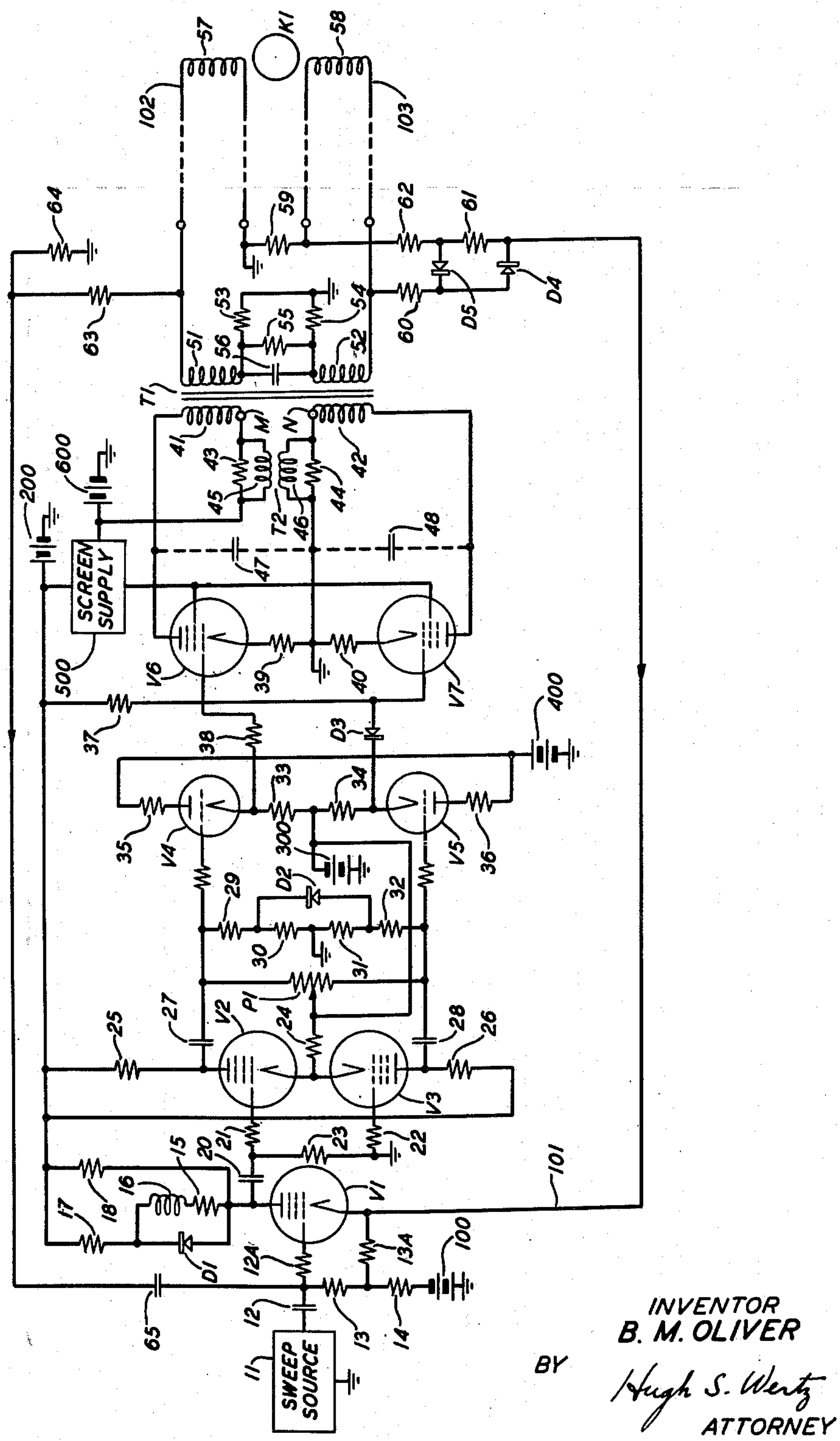

This invention relates to amplifier circuits and, more particularly, to circuits for amplifying repetitive asymmetrical wave forms. For example, the invention has special application to amplifier circuits for amplifying sweep waves, each cycle of which comprises a first portion varying gradually in a first direction and a second portion varying sharply in the opposite direction. With such sweep wave signals, it may be desirable to alter the state or configuration of the amplifier between the two portions of this wave form so that for the first portion the amplifier is in a first state or configuration, while for the second portion the amplifier is in a second state or configuration.

In an important aspect, the present invention provides improvements for the amplifier circuit for driving reactive loads described in my Patent No. 2,516,797, issued July 25, 1950. By way of example, it will be discussed with reference thereto, although, as will be evident from the description to follow, features of the present invention have wider applicability and so are not intended to be limited to incorporation in that one specific arrangement.

In this prior amplifier circuit, two electron tubes supplied with an input sweep-wave voltage, each cycle of which comprises a sweeping portion and a return portion, are operated in push-pull manner under class B conditions to supply a reactive load, comprising an output transformer and a pair of deflection coils connected in the output circuit thereof. One of these tubes draws its plate power, during one half of the sweeping portion of the sweep-wave cycle, from the energy stored in the reactive load by the other tube during the other half of the sweeping portion of each sweep-wave cycle. A feedback connection from the output of this amplifier circuit to the input thereof is employed to achieve a high degree of linearity of amplification during the sweeping portion of the sweep wave.

Although this circuit has been found to operate successfully, difficulties are sometimes experienced in realizing as much stable loop gain as is desired, in obtaining proper balance of tube operating currents under different conditions of drive, and from resonance effects that sometimes arise as a result of the reactive load.

In particular, it is important that there be considerable feedback during the forward portion of the sweep in order to improve the linearity and to speed recovery after flyback. But during flyback, neither output tube should conduct plate current so that the output load circuit can describe a half cycle of its natural free oscillation and thereby fully reverse the sweep current in the yoke.

Accordingly, one object of the present invention is to improve such amplifier circuits by overcoming these and related difficulties.

In particular, one object is to provide an improved feedback path wherein the feedback can be controlled in accordance with the direction in which the signal is varying.

These and other related objects are attained in accordance with the invention in an exemplary embodiment by providing a sweep amplifier circuit in which the feedback loop comprises effectively two separate feedback paths, one operative only during the sweeping portion of the sweep-wave cycle for returning a first portion of the output to the input, and the other operative only during the return portion of the cycle for returning a different portion of the output to the input. Such an effect is achieved by the use of directionally sensitive elements in the output circuit to control separate feedback paths therefrom.

Figure 3:
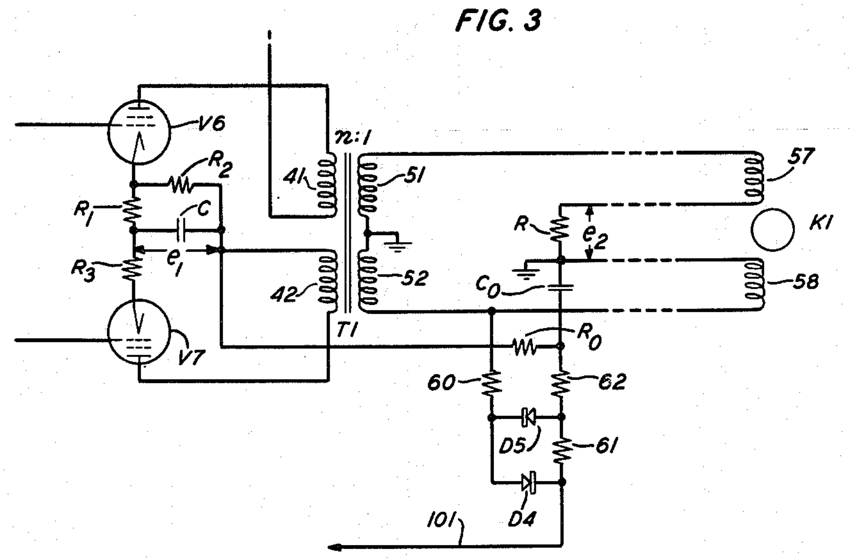
Figure 2:
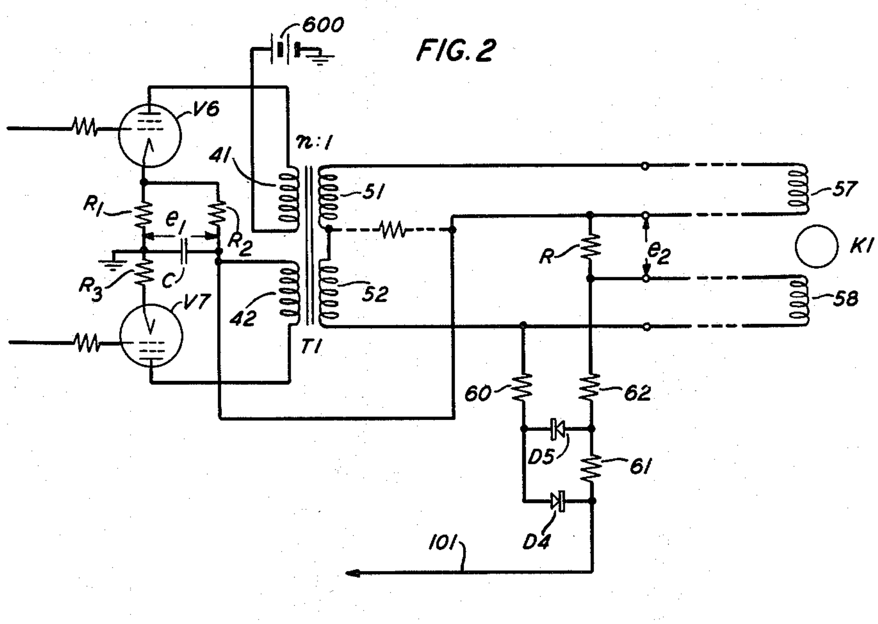

The invention will be more fully understood with reference to the following more detailed description taken in connection with the accompanying drawings forming a part thereof, in which:

Fig. 1 shows diagrammatically a high efficiency sweep amplifier wherein there is embodied a feedback circuit in accordance with the invention;

Figs. 2 and 3 show diagrammatically alternative arrangements which allow direct-current coupling feedback; and Figs. 4, 5, 6 and 7 are representations of the wave forms of certain of the currents and voltages in the systems of Figs. 1 through 3.

With reference more particularly to the drawings, in Fig. 1 there is shown, by way of example for purposes of illustration, a high efficiency sweep amplifier of the kind described in the above-identified patent but modified in accordance with the present invention. The sweep waves, each cycle of which comprises a sweeping portion and a return portion, are supplied from a sweep source 11, which can, for example, be a sweep-wave generator of the kind described in the aforementioned patent, by means of a coupling condenser 12 and anti-sing resistance 12A to the control grid of the input amplifier stage, tube V1. The tube V1 is operated as an amplifying stage having its grid biased negative with respect to the cathode by means of the arrangement comprising the resistances 13, 13A, and 14 and the voltage supply 100 and having a plate circuit which comprises the arrangement including the resistances 15, 17 and 18, the inductance 16, and the crystal diode D1. In addition, the cathode of tube V1 is connected by the lead 101 to the output stage by way of a feedback path to be described in more detail hereinafter. In operation, the grid-cathode voltage is determined by the difference between the input signal on the grid and the feedback voltage on the cathode. During the flyback period of the sweep wave, the input voltage to the grid drops sharply. However, since the feedback voltage applied to the cathode lags this sharp drop, for a time there is developed an overload signal between the grid and cathode which cuts tube V1 off sharply. This action tends to generate a large positive pulse of plate voltage during flyback, and unless precautions are adopted, the direct-current component of this pulse unbalances the biases on the subsequent stages of the amplifier during the rest of the cycle. However, this difficulty is avoided by the plate circuit arrangement used for tube V1. The operating current required for high gain and linearity in this tube is much larger than the plate current swing required for the signal wave, and in the present arrangement all but the small portion required for signal swings is bled to the plate supply 200 by the shunt resistance 18. The remainder flows through the load resistance 15, the high frequency compensating inductance 16, and the resistance 17 to the plate supply 200. If the tube plate current drops below that required for the signal wave, the voltage across the resistance 15 reverses, and the crystal diode D1 shunts out the resistance 15 and inductance 16 until the current has risen sufficiently.

The output from this amplifying stage V1 is supplied by means of the coupling condenser 20 and the grid circuit arrangement made up of resistance 21 and 23 to the push-pull amplifier comprising the tubes V2 and V3. The output from the tube V1 is supplied to the control grid of tube V2, while the control grid of tube V3 is kept substantially fixed at ground potential by means of the low resistance 22. The cathodes of the two tubes V2 and V3 are connected together and through the cathode resistance 24 to the negative terminal of the voltage supply 300 whose positive terminal is grounded. The plate voltages are supplied through the anti-sing resistances 25 and 26, respectively, from the voltage supply 200. Push-pull operation is achieved by making the common cathode resistance 24 very large with respect to $1/g_m$ where $g_m$ is the transconductance of the tubes. The voltage drop across resistance 24 is substantially constant because the signal variations on the control grid, which are reproduced at about one-half amplitude on the cathodes, are small compared to the large supply voltage which is the principal contributor of the voltage across the resistance 24. As a result, the current flow through the resistance 24 is substantially constant. Since this current flow is substantially constant, current changes in the tube V2 must be nearly equal and opposite to those in tube V3. This is the condition for balanced push-pull operation.

The equal and opposite outputs from tubes V2 and V3 are supplied by means of the coupling condensers 27 and 28 and the balanced grid circuit arrangement which includes the potentiometer P1 to a push-pull cathode-follower comprising tubes V4 and V5. Varying the position of the tap of the potentiometer P1 enables compensation to be made for unbalances in the push-pull stages V4 and V5 and V6 and V7, in the usual fashion. The grid circuit of tubes V4 and V5 also comprises the arrangement made up of resistances 29, 30, 31, and 32 and the crystal diode D2. The function of this arrangement will be described hereinafter. The cathode-to-plate circuits of tubes V4 and V5 include in turn the cathode resistances 33 and 34, whose junction point is connected to the negative terminal of the voltage supply 300, and the anti-sing resistances 35 and 36, through which plate voltage is supplied from the voltage supply 400. The push-pull outputs from the tubes V4 and V5 are supplied to the amplifier output stage comprising the tubes V6 and V7, respectively. The output from tube V5 is supplied by way of the resistance 38, while that from tube V6 is supplied by way of the crystal diode D3. During flyback, a very large positive signal is applied to the grid of tube V7, which would tend to draw a large grid current in this tube. To prevent this, there is inserted the crystal diode D3 in the grid circuit of tube V7, which diode is held normally conducting by current bled from the voltage supply 200 through the resistance 37. The cathodes of the tubes V6 and V7 are grounded by way of the cathode resistances 39 and 40, respectively. The screen grids of tubes V6 and V7 are maintained at the necessary positive potentials during the sweeping portion of the sweep wave and at lower potentials during the flyback portion by the screen grid supply 500 in a manner more fully described in the aforementioned patent. The plate of tube V6 is supplied with plate voltage from the voltage supply 600 by way of the primary winding 41 of the output transformer T1 and the shunt arrangement of the winding 45 of the auxiliary transformer T2 and its damping resistance 43, while the plate of the tube V7 is connected to ground through the primary winding 42 of the output transformer T1 and the shunt arrangement of the winding 46 of the auxiliary transformer T2 and its damping resistance 44. The distributed or stray capacities associated with the transformer T1 and the plates of tubes V6 and V7 are indicated by the two capacities 47 and 48. The secondary of the transformer T1 comprises the two windings 51 and 52 to which are connected by means of the leads 102 and 103 the deflection coils 57 and 58 of the cathode-ray tube K1. These deflection coils are supplied in a balanced arrangement with equal and opposite sweep currents in order to derive the advantages of a balanced deflection system. The other leads of the two windings 51 and 52 are connected to ground through an arrangement comprising the resistances 53, 54, and 55 and the condenser 56. This arrangement serves to damp out longitudinal resonance modes set up in these windings during operation.

For operation, the sense of the input sweep waves is arranged such that during the sweeping portion of the wave cycle, the potential of the control grid of the tube V6 becomes less negative, while the potential of the control grid of the tube V7 becomes more negative. Then during the return portion of the cycle, the potentials on the control grids of the tubes V6 and V7 become more and less negative, respectively. The control grids of the output tubes V6 and V7 are so biased that at a time $t_1$ near the middle of the sweeping portion of the input waves, both tubes are substantially cut off (nonconducting). As time proceeds until the end of the sweeping portion of the sweep wave, tube V7 continues cut-off while the plate current in tube V6 increases in a substantially linear fashion. The linear increase in plate current in the tube V6 causes the plate voltage of this tube to be lowered to a value $E_B - E_L$, where $E_B$=voltage of supply 600

$$E_L = L\frac{di}{dt}$$

and $L$=inductance of winding 41 with the deflecting coils connected to the secondary of transformer T1.

With the windings 41 and 42 equal and wound in series-aiding relationship, a positive voltage $E_L$ is present on the plate of the tube V7 during all of the sweeping portion of the cycle.

At the time $t_2$, at the end of the sweeping portion of the sweep wave, the plate current in the tube V6 reaches a peak value I. Thereafter, during the flyback portion of the sweep wave, the grid voltage of tube V6 is driven negative past cut-off by the input wave, and the plate current drops to zero. This abrupt stoppage of plate current in tube V6 induces a transient in the load circuit, causing the plate voltage of tube V6 to become very positive and the plate voltage of tube V7 very negative. During this flyback time $\tau$, neither tube V6 nor tube V7 can conduct plate current. A current step of magnitude I is thus introduced into the load. The load transient, assuming the damping to be small, is a substantially sinusoidal oscillation. The time $\tau$ is approximately one-half cycle of this oscillation. At the time $t_3 = t_2 + \tau$, the current in the load has fully reversed, and the potential of the plate of tube V7 again becomes positive. The control grid of this tube is already at such a potential that a plate current can flow, as soon as the plate voltage becomes positive. When this happens, a second step of current of magnitude I is applied to the load at time $t_3$ in the same sense as the first step from tube V6 at the time $t_2$. The load transient from this second step, being one-half cycle later, is out of phase with the transient from the first step, and the two waves cancel leaving the plate of tube V7 at the potential $E_L$ and a current I in winding 52. The control grid potential of tube V7 now becomes progressively more negative, decreasing the plate current in a linear fashion until the middle of the cycle is again reached at time $t_4 = t_1 + T$, where T equals the duration of one complete cycle of the sweep wave. At the time $t_4$, tube V7 discontinues conducting, whereas tube V6 again conducts, and the cycle repeats. As a consequence, there is provided in each of the secondary windings an output current which substantially resembles the sweep waves. For a fuller description of the principles of operation of this output arrangement, reference is made to the aforementioned patent.

In the circuit described in this aforesaid patent, there is provided a feedback path from a current monitoring resistance in series with the secondary winding of the output transformer back to the cathode of a preceding amplifier stage. However, since the transmission of the output circuit tends to fall too rapidly at higher frequencies, some equalization in the form of rising transmission with frequency is required in the region of gain crossover to insure stability and good transient response.

Figure 4:
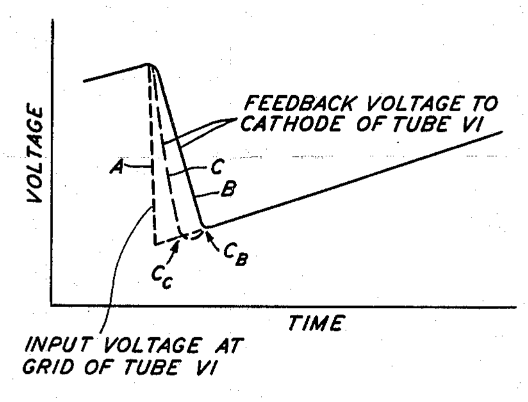

With circuits of this kind, it is important to have considerable feedback during the sweeping portion of the cycle in order to improve the linearity and to speed recovery after flyback, but during flyback, neither tube V6 nor tube V7 should conduct plate current in order that the output load circuit can describe a half cycle of its natural free oscillation and thereby fully reverse the sweep current in the yoke. If the feedback has flat transmission with frequency, this will be the case. In Fig. 4, the voltage waves on the input amplifier tube V1 during flyback are shown. The curves are shifted by the operating grid bias, so that during the forward sweep they substantially coincide. During the flyback return portion, the input wave to the control grid drops very rapidly, as shown by the dotted line A. With a flat feedback loop, the voltage feedback to the cathode will drop, as shown by the solid line B. So long as the grid voltage curve is appreciably more negative than the cathode voltage curve on this drawing, the tube V6 will be cut off, and no plate current will flow therein. The tube V7 is unable to conduct during this time, since its plate voltage is negative. As a result, the desired free oscillation is executed, and the feedback loop recloses after one-half cycle of this oscillation, at $C_B$, to start the next trace. But if, for equalization purposes, a rising gain characteristic is included in the feedback circuit by the orthodox technique of, say, inserting an inductance in series with the current monitoring resistance, the voltage will drop, as shown by the broken line C, since the rising gain characteristic adds a time-derivative component to the return voltage A. At $C_c$, the signal input to the first tube is reversed and the tube V6 is turned on, and power is wasted in stopping the flyback prematurely.

Since it is desirable to avoid using a series inductance, the rising gain characteristic is achieved by adding a component of feedback voltage proportional to the voltage across the sweep coil 58, and this component of return voltage is removed during flyback so that the difficulty of premature termination of flyback is avoided. In practice, it has been found advantageous to leave in a fraction of this component so that the signal voltage on tube V1 reverses a little early to compensate for the delay in the intermediate amplifying stages.

It can be seen that what is desired, in effect, is a feedback arrangement which, during the sweeping or first portion, is in a first state or configuration providing a first amount of feedback and which, during the return or second portion, is in a second state or configuration providing a second amount of feedback.

The arrangement connected in the circuit of the secondary winding 52 of the output transformer T2 comprising the resistances 59, 60, 61, and 62 and the unidirectionally conducting crystal diodes D4 and D5 serves this purpose. The resistance 59 provides at all times during the sweep wave a return voltage proportional to the current in the sweep coil 58. Additionally, the path consisting of resistance 60, the crystal diode D4, and the series resistances 61, 62 and 59 provides during the sweeping portion or forward trace a component of return voltage proportional to voltage across the sweep coil 58, and the path consisting of the resistance 60, crystal diode D5, and the series resistances 62 and 59 provides during retrace or flyback a lesser component, also proportional to the voltage across the sweep coil 58. In this way, there are achieved two separate paths, one operative only during the sweep portion when, because of the unilaterally conducting character of the diodes D4 and D5, the current flow in the sweep coil circuit is in one direction, the other operative only during the return portion when the current flow therein is in the opposite direction.

Additionally, it has been found that the performance of this sweep amplifier circuit is enhanced by several additional refinements which have been embodied in the arrangement shown in Fig. 1.

Because of the large amount of negative feedback employed, the transmission of the output transformer T1 must be controlled over the frequency range up to several megacycles. Large peaks and dips in the transmission caused by resonances within the windings are particularly undesirable. To suppress these resonances, the primary windings 41 and 42 are wound with material which shows increased resistance at high frequencies. For example, the increased resistance of iron wire as compared with copper wire is not great enough below 100 kilocycles to affect the transmission appreciably, but, however, above 100 kilocycles, the enhanced skin effect caused by the high magnetic permeability of the iron becomes significant. At 1 megacycle, the resistance is increased several times over the direct-current value, and resonances around this frequency and above are damped out. It is evident that nickel, or permalloy-plated copper wire, also would be suitable for this type of application.

Since the output stages V6 and V7 are operated class B, the output transformer T2 is not driven in a balanced manner at all times. Instead, at the start of flyback, a current step is produced in the high primary winding 41, and at the end of flyback, a current step is produced in the high primary winding 42. This type of drive, applied as it is to only one input winding at a time, excites an unwanted mode of oscillation in the transformer T1. This mode involves the plate and winding distributed capacities and the leakage inductance between windings 41 and 42. For this unwanted mode, the currents in terminals M and N are in the same sense, i. e., both into or both out of the primary windings at a given instant. For the desired mode of oscillation during flyback (the mode involving the plate and distributed capacities and the transformed load inductance), the currents at terminals M and N are oppositely directed. These current relationships are utilized by connecting an auxiliary transformer T2, having a 1:1 ratio, between terminals M and N. The windings 45 and 46 of this transformer are so poled that a current out of the terminal M and into terminal N will produce no flux in the core, and substantially no voltage will appear across its terminals. Hence, the transformer offers little impedance to the wanted mode. For the unwanted mode, however, it presents a large inductive reactance, and most of the current for this mode flows through the damping resistances 43 and 44, shunting the windings 41 and 42, respectively, which quickly damps the unwanted mode. Since the unwanted mode is of higher frequency than the desired modes, the requirements on this auxiliary transformer are easy to meet, i. e., the simple increase in the inductive reactance of each winding alone will provide some discrimination between modes even if there were no coupling in the transformer.

As an additional refinement, there is incorporated an arrangement for neutralization of the grid-cathode capacity of the input stage V1. Since the input circuit to this first grid has a high impedance level, the grid-cathode capacity of this stage reduces the loop gain at high frequencies, since voltages applied to the cathode appear also on the grid by capacity potentiometer action. Since the output circuit is balanced, reverse polarity signals may be fed back by the arrangement of the resistances 63 and 64 to the grid of tube V1 through a capacitance 65 which is made equal to the grid-cathode capacity of the tube V1. This neutralizes any displacement current to the grid thereof and hence cancels the spurious potential variations.

As a further refinement, there is incorporated into the grid circuit of the cathode-followers V4 and V5 an arrangement comprising the resistances 29, 30, 31 and 32 and the crystal diode D2. Because of output circuit losses, the peak current and consequently the average current required in tube V6 are greater than that required in the parasitic tube V7. The instantaneous plate current in these two tubes must therefore be equal at a time $t_0$ somewhat prior to the middle of the forward trace. As the sweep amplitude is varied, the input sweep waves to the grids of these tubes should not change potential at the time $t_0$. Variations in sweep amplitude should cause the grid wave forms on V7 and V6 to rock around this point as the slope changes rather than around the mid-point of the cycle. This action is assured by the use of the crystal diode D2. This diode makes the effective grid leak resistance higher for one signal polarity than the other. A voltage proportional to the sweep-wave signal is rectified by the diode D2, and, as the input level is changed, the potential at the middle of the sweep changes, but the resistance values are so chosen that the potentials at $t=t_0$ remain fixed.

Although the above-described arrangement is satisfactory in performance, the necessity of properly shaping the loop gain characteristic at the low end of the frequency spectrum, even in the case of relatively high frequency input sweep waves, results in large values of coupling and bypass condensers. These large components can be avoided by a direct-current interstage coupling. Another advantage accruing from direct-current coupling is the stabilization of the operating current in the output tubes V6 and V7 against changes caused by the direct-current component of the peak voltages produced in the amplifier during flyback when the feedback loop is broken. However, it is impractical to use direct-current coupling in the amplifier without at the same time providing direct-current feedback which includes all the direct-coupled stages, since without feedback the high gain of the amplifier would amplify small drifts in the input stage into disturbances so large that the output stage would be seriously unbalanced or even rendered inoperative.

In Fig. 2, there is shown a simplified alternative output arrangement in accordance with the invention which allows direct-current coupling to be used in the feedback loop. This output arrangement is for use with an amplifier which uses direct-current interstage coupling in the intervening stages. The resistance $R_1$ and capacitance C are included in the primary side of the output transformer T1. The voltage $e_1$ developed across the condenser C is combined with the voltage $e_2$ across the current monitoring resistence R in the secondary side of the output transformer in such a fashion that the loop gain of the feedback path is maintained flat to zero frequency, while at the same time normal feedback is maintained over the sweep frequency spectrum.

This arrangement can be analyzed as follows. First, let it be assumed that neither tube V6 nor tube V7 draws either control or screen grid current. In this case, the value of resistances $R_2$ and $R_3$ would be made zero. Then the plate current in tube V6 would all flow through resistance $R_1$ to ground, and the plate current for the parasitic tube V7 would be drawn from ground through resistance $R_1$. Therefore, the entire signal wave, including the direct-current component, applied to the primary side of the output transformer T1 would flow through the resistance $R_1$. If $R_1$ were chosen equal to $n$R, where $n$ is the turns ratio of either of the two identical primary windings 41 or 42 to the entire secondary comprising the windings 51 and 52, then for frequencies in the middle of the pass-band of transformer T1, the voltages across $R_1$ and R would be equal.

Figure 5:
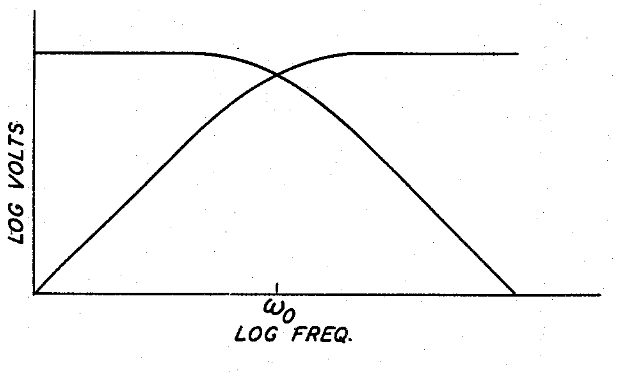

If $R_s$ equals total output circuit loop resistance and M equals the mutual inductance of the transformer T1 (referred to the secondary side), then at the frequency $$\omega_0=\frac{R_s}{M}$$

the voltage $e_2$ across the resistance R will fall 3 decibels from its mid-band value. Below this frequency, the transmission drops at the rate of 6 decibels/octave. This is shown as curve A in Fig. 4. By shunting the resistance $R_1$ with a capacitance $$C=\frac{1}{\omega_0 R_1}$$

the voltage $e_1$ will drop at the rate of 6 decibels/octave for frequencies above $\omega_0$, as shown by curve B in Fig. 5. Therefore, the voltages $e_1$ and $e_2$ are supplementary as the frequency is varied so that the sum of voltage $e_1+e_2$ is a constant voltage $e$ independent of frequency in the region under consideration. If the voltages $e_1$ and $e_2$ are added in series, as in the arrangement of Fig. 2, to obtain the voltage for feedback, then the loop gain can be maintained constant from sweep frequency down to zero frequency.

Figure 6:
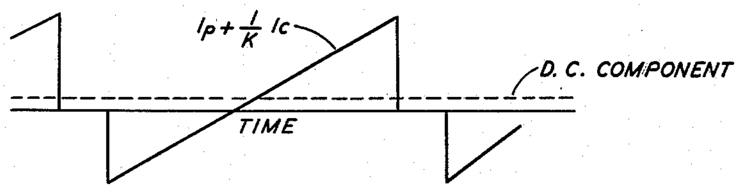

However, the existence of screen current in tube V6 will make the cathode current $i_c$ through resistance $R_1$ greater than the plate current $i_p$ by a factor K, which is slightly greater than unity. If resistance $R_2$ were still kept equal to zero, there would result a distorted wave form of current into the parallel combination of resistance $R_1$ and capacitance C because of this difference. However, if an arrangement is provided in which:

$$(R_1+R_2)i_p=R_1 i_c$$

$$R_2=R_1\frac{(i_c-i_p)}{i_p}=R_1(K-1)$$

then this effect is compensated. By this arrangement, there is utilized for feedback the entire plate current of tube V7 but only a fraction 1/K of the cathode current of tube V6. Since $$\frac{i_c}{K}=i_p$$

the action will be as shown in Fig. 6. Resistance $R_3$ may now be made equal to the parallel value of resistance $R_1$ and $R_2$ to provide the same cathode degeneration in tubes V6 and V7 at the signal frequencies. Thus, in the arrangement of Fig. 2, $$R_1=\frac{nR}{K}$$

$$R_2=R_1(K-1)=nR\frac{K-1}{K}$$

$$R_3=nR\frac{K-1}{K^2}$$

Figure 7:
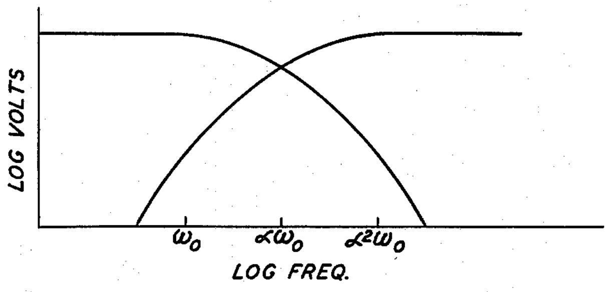

The output circuit illustrated in Fig. 2, however, has the disadvantage that the entire secondary of the transformer T1 is maintained above the ground by the voltage $e_1$. An alternative output circuit which comprises a direct-current feedback loop wherein this disadvantage is eliminated is illustrated in Fig. 3. Herein, the two voltages $e_1$ and $e_2$ are combined by means of a dividing arrangement which comprises the resistance $R_0$ and the capacitance $C_0$. If as above $$\omega_0=\frac{R_s}{M}$$

and the values of $R_0$, $C_0$, and C are so chosen that $$R_0 \gg R_1+R_2,\ R$$

$$\frac{1}{R_0 C_0}=\alpha\omega_0$$

$$\frac{1}{(R_1+R_2)C}=\alpha^2\omega_0$$

where $\alpha>1$, then the action will be as shown in Fig. 7, in which curve D shows the compensated $e_1'$ and curve E the compensated $e_2'$. Although the two voltages are no longer exactly supplementary, they become more nearly so for increasing values of $\alpha$.

It is evident that the direct-current coupling arrangements described with reference to Figs. 2 and 3 can be used independently or else can be combined with the non-linear feedback arrangement described with reference to Fig. 1 to provide a feedback loop compensated over a broad band of frequencies.

It is to be understood that the above-described arrangements are merely illustrative of the principles of the invention. Other arrangements may be devised by one skilled in the art without departing from the spirit and scope of the invention.

What is claimed is:

1. In an amplifier for asymmetric input waves, each cycle of which comprises a first portion varying in a first direction and a second portion varying in the opposite direction, an amplifying element having an input and an output circuit, said output circuit having a reactive load comprising an output transformer and a reactive element connected across the secondary windings thereof, and a feedback path from said output circuit to said input circuit including resistance means in series with the secondary winding and the reactive element for returning during the whole of each cycle a voltage proportional to the current flowing through the reactive element, first resistance means, including a unilaterally conducting element, in shunt across the reactive element for returning during the sweeping portion of each cycle a first portion of the voltage thereacross, and second resistance means, including a unilaterally conducting element, in shunt across the reactive element for returning during the return portion of each cycle a different second portion of the voltage thereacross.

2. In an amplifier for saw-tooth input waves, each cycle of which includes a first sweep portion and a second return portion, an amplifying element having an input and an output circuit, said output circuit having a reactive load comprising an output transformer and an inductive element connected across the secondary windings thereof, and a feedback path from said output circuit to said input circuit comprising a first resistance means in series with the secondary windings and the inductive element for returning during the whole of each cycle a first voltage proportional to the current flowing through the inductive element, first resistance means, including a unilaterally conducting element, in shunt across the primary windings of the output transformer for returning during the sweep portion of each cycle a portion of the voltage thereacross, and second resistance means, including a unilaterally conducting element, in shunt across the primary windings of the output transformer for returning during the return portion of each cycle a second portion of the voltage thereacross.

3. A sweep amplifier circuit comprising two electron discharge devices, each having an input and an output circuit, means for applying in push-pull manner to the input circuits of said two devices a saw-tooth wave, each cycle of which has a sweeping portion and a return portion, a reactive load including a transformer having two primary windings and a secondary winding with a reactive element connected thereto, means, including a source of direct-current potential connected in the output circuit of the first of said devices and one of said primary windings, for storing energy in the reactive load for part of the sweeping portion of each cycle of the saw-tooth wave, means, including the other primary winding and said secondary winding, for returning power from the reactive load to the second of said two devices during another part of the sweeping portion of each cycle, resistance means in series with the reactive element and said secondary winding for returning to the input circuits during the entire cycle a first voltage proportional to the current flow in the reactive element, resistance means, including first and second oppositely poled unilaterally conducting elements, in shunt with the reactive element for returning to the input circuits first and second different portions of the voltage across the reactive element during the sweeping and return portions of each cycle, respectively.

4. A sweep amplifier circuit comprising two electron discharge devices each having an input and an output circuit, means for applying in push-pull manner to the input circuits of said two devices a saw-tooth wave, each cycle of which has a sweeping portion and a return portion, a reactive load including a transformer having two primary windings and a secondary winding with an inductive element connected thereto, means, including a source of direct-current potential connected in the output circuit of the first of said devices and one of said primary windings, for storing energy in the reactive load for part of the sweeping portion of each cycle of the saw-tooth wave, means, including the other primary winding and said secondary winding, for returning power from the reactive load to the second of said two devices during another part of the sweeping portion of each cycle, resistance means in series with the inductive element and the secondary winding for returning to the input circuits during the entire cycle a first voltage proportional to the current flow in the inductive element, and resistance means including first and second oppositely poled unilaterally conducting elements in shunt across a primary winding of the output transformer for returning to the input circuits first and second different portions of the voltage across this primary winding during the sweeping and return portions of each cycle, respectively.

BERNARD M. OLIVER.

REFERENCES CITED

The following references are of record in the file of this patent:

UNITED STATES PATENTS

| Number | Name | Date |
|---|---|---|
| 1,985,352 | Numans | Dec. 25, 1934 |
| 2,440,786 | Schade | May 4, 1948 |
| 2,447,507 | Kenyon | Aug. 24, 1948 |
| 2,466,712 | Kenyon | Apr. 12, 1949 |
| 2,466,784 | Schade | Apr. 12, 1949 |